United States Patent
Bruley et al.

(10) Patent No.: US 10,529,832 B2
(45) Date of Patent: Jan. 7, 2020

(54) SHALLOW, ABRUPT AND HIGHLY ACTIVATED TIN EXTENSION IMPLANT JUNCTION

(71) Applicant: International Business Machines Corporation, Armonk, NY (US)

(72) Inventors: John Bruley, Poughkeepsie, NY (US); Marinus J. P. Hopstaken, Carmel, NY (US); Kam-Leung Lee, Putnam Valley, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 4 days.

(21) Appl. No.: 15/383,537

(22) Filed: Dec. 19, 2016

(65) Prior Publication Data
US 2018/0175174 A1   Jun. 21, 2018

(51) Int. Cl.
| | |
|---|---|
| *H01L 29/66* | (2006.01) |
| *H01L 21/265* | (2006.01) |
| *H01L 29/10* | (2006.01) |
| *H01L 29/207* | (2006.01) |

(52) U.S. Cl.
CPC .. *H01L 29/66803* (2013.01); *H01L 21/26546* (2013.01); *H01L 21/26586* (2013.01); *H01L 29/1041* (2013.01); *H01L 29/207* (2013.01)

(58) Field of Classification Search
USPC ........................................... 438/301; 257/401
See application file for complete search history.

(56) References Cited

U.S. PATENT DOCUMENTS

| | | | |
|---|---|---|---|
| 6,037,640 A | 3/2000 | Lee | |
| 7,928,427 B1 | 4/2011 | Chang | |
| 8,912,070 B2 | 12/2014 | Ma et al. | |
| 8,937,299 B2 | 1/2015 | Basu et al. | |
| 2005/0009285 A1* | 1/2005 | Luning | H01L 21/28114 438/305 |
| 2006/0220112 A1* | 10/2006 | Zhu | H01L 21/26506 257/335 |
| 2009/0065868 A1* | 3/2009 | Russ | H01L 21/845 257/351 |
| 2010/0301390 A1* | 12/2010 | Ko | H01L 29/7851 257/190 |
| 2013/0154016 A1* | 6/2013 | Glass | H01L 29/78 257/368 |

(Continued)

OTHER PUBLICATIONS

Huang et al., "High performance In0.53Ga0.47As FinFETs fabricated on 300 mm Si substrate," 2016 Symposium on VLSI Technology Digest of Technical Papers, 2016, 2 pages.

(Continued)

*Primary Examiner* — Timor Karimy
(74) *Attorney, Agent, or Firm* — Cantor Colburn LLP; Vazken Alexanian (57) ABSTRACT

Embodiments are directed to a method of forming a semiconductor device and resulting structures having a shallow, abrupt and highly activated tin (Sn) extension implant junction. The method includes forming a semiconductor fin on a substrate. A gate is formed over a channel region of the semiconductor fin. A Sn extension implant junction is formed on a surface of the semiconductor fin in the channel region.

13 Claims, 4 Drawing Sheets

(56) References Cited

U.S. PATENT DOCUMENTS

2015/0318282 A1* 11/2015 Rodder ........... H01L 21/823418
  257/392
2016/0005736 A1   1/2016 Xiao
2016/0240367 A1*  8/2016 Kimura ............... H01L 21/0228
2017/0125527 A1*  5/2017 Pillarisetty ...... H01L 21/823821

OTHER PUBLICATIONS

Kong et al. "Toward Conformal Damage-Free Doping With Abrupt Ultrashallow Junction: Formation of Si Monolayers and Laser Anneal as a Novel Doping Technique for InGaAs nMOSFETs," IEEE Transactions on Electron Devices, vol. 61, No. 4, Apr. 2014, pp. 1039-1046.

Kubiak et al. "Electrical and optical properties of Si- and Sn-doped $In_xGa_{1-x}As$ (x? 0.53) grown by molecular beam epitaxy," Journal of Applied Physics, vol. 55, No. 2, Jan. 15, 1984, pp. 598-600.

Lind et al. "Maximizing electrical activation of ion-implanted Si in $In_{0.53}Ga_{0.47}As$," Applied Physics Letters, vol. 103, No. 23, 2013, pp. 232102-1-232102-4.

Radosavljevic et al. "Electrostatics Improvement in 3-D Tri-gate Over Ultra-Thin Body Planar InGaAs Quantum Well Field Effect transistors with High-K Gate Dielectric and Scaled Gate-to-Drain/Gate-to-Source Separation," International Electron Devices Meeting (IEDM), 2011, pp. 33.1.1-33.1.4.

* cited by examiner

SHALLOW, ABRUPT AND HIGHLY ACTIVATED TIN EXTENSION IMPLANT JUNCTION

BACKGROUND

The present invention relates in general to semiconductor device fabrication methods and resulting structures. More specifically, the present invention relates to fabrication methods and resulting structures for a semiconductor device having a shallow, abrupt and highly activated tin (Sn) extension implant junction.

In contemporary semiconductor device fabrication processes a large number of semiconductor devices such as field effect transistors (FETs) and on-chip capacitors are fabricated on a single wafer. Some non-planar device architectures, such as fin field effect transistors (finFETs), employ semiconductor fins and side-gates that can be contacted outside the active region, resulting in increased device density and some increased performance over lateral devices. A typical finFET device includes a vertical fin or nanowire that extends upward from the substrate. The fin or nanowire forms the channel region of the transistor. A source region and a drain region are situated in electrical contact with the top and bottom ends of the channel region, and the gate is disposed on one or more of the fin or nanowire sidewalls.

SUMMARY

According to one or more embodiments of the present invention, a method of fabricating a semiconductor device having a shallow, abrupt and highly activated tin (Sn) extension implant junction is provided. The method includes forming a semiconductor fin on a substrate. The method further includes forming a gate over a channel region of the semiconductor fin. The method further includes forming a Sn extension implant junction on a surface of the semiconductor fin in the channel region.

According to one or more embodiments of the present invention, a semiconductor device having a shallow, abrupt and highly activated tin (Sn) extension implant junction is provided. The device includes a semiconductor fin formed on a substrate. The device further includes a gate formed over a channel region of the semiconductor fin. The device further includes a Sn extension implant junction formed on a surface of the semiconductor fin in the channel region.

According to one or more embodiments of the present invention, a method for forming an extension implant junction in a channel region of a semiconductor fin is provided. The method includes providing the semiconductor fin on a wafer and positioning the wafer in a first position such that an ion beam tilt angle for implanting a dopant into the channel region is about 7 degrees to about 45 degrees. The method further includes implanting the dopant into the channel region while the wafer is in the first position and rotating the wafer into a second position. The method further includes implanting the dopant into the channel region while the wafer is in the second position.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. The term "selective to," such as, for example, "a first element selective to a second element," means that a first element can be etched and the second element can act as an etch stop. The term "conformal" means that the thickness of, e.g., a conformal liner, is substantially the same on all surfaces, or that the thickness variation is less than 15% of the nominal thickness.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

As used herein, the term "junction depth" refers to the depth (typically in nanometers) at which a dopant concentration falls below about $1 \times 10^{18}$ ions/cm$^3$. Extension junctions do not have a controlling effect at dopant concentrations less than about $1 \times 10^{18}$ ions/cm$^3$. As used herein, the term "junction slope" refers to the slope of the dopant concentration vs depth line between a dopant concentration decade (e.g., the change of depth in nanometers over which the dopant concentration decreases from $1 \times 10^{19}$ ions/cm$^3$ to $1 \times 10^{18}$ ions/cm$^3$. Extension junction profiles having a steep line are referred to as "abrupt" junctions.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE), and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of technologies that are more specifically relevant to aspects of the present invention, as previously noted herein, one technique for scaling semiconductor architectures is to employ non-planar device architectures such as a finFET. There are challenges, however, in scaling non-planar architectures beyond the 10 nm node. One challenge in scaling finFETs is a corresponding increase in short channel effects, such as drain induced barrier lowering (DIBL) and subthreshold swing, as gate lengths shrink. Short channel effects result in a loss in device performance.

One approach to mitigating short channel effects is the use of doped source/drain extension implant junctions (i.e., the interface between the fin and gate in the channel region adjacent to the source/drain). Forming source/drain extension implant junctions having a high dopant concentration can significantly improve both the ON-state device resistances (e.g., source/drain resistance and contact resistance at the source/drain metal-semiconductor interface) and subthreshold performance of a device. Abrupt, shallow, and highly activated (also referred to as "high-quality") junctions also suppress source-to-drain leakage and DIBL.

The use of extension implant junctions, however, introduces new difficulties, especially when coupled with improved semiconductor fin materials such as III-V compound semiconductors. III-V compound semiconductor fins are increasingly relied upon to improve scaled device performance, due in part to their larger electron mobilities as compared to silicon (Si) or germanium (Ge). Ion-implanted dopants (such as those required for extension implant junctions) tend to have a relatively low solubility in III-V compound semiconductors. Consequently, it is difficult to formed abrupt, shallow, and highly activated junctions in high performance III-V compound semiconductor finFETs.

Conventional extension implant junctions in III-V compound semiconductor materials such as indium gallium arsenide (InGaAs) fins are formed using Si. Si-based junctions have poor junction depths (junction depths greater than about 30 nm) even with low implant energies (e.g., implant energies of less than about 5.0 keV). Si-based junctions also have poor junction slopes (e.g., about 12 nm per Si concentration decade at an anneal temperature of 550 Celsius for 30 seconds). Consequently, Si-based junctions in InGaAs fins result in poor short channel characteristics (e.g., DIBL) and reduced device performance. Thus, a method is desired for forming abrupt, shallow, and high-quality extension implant junctions in III-V compound semiconductor-based devices.

Turning now to an overview of the aspects of the present invention, one or more embodiments described herein provide methods of fabricating a III-V compound semiconductor-based device having abrupt, shallow, and high-quality tin (Sn) extension implant junctions. Sn-based extension implant junctions have been found to offer several advantages over conventional Si-based junctions. First, Sn-based junctions can achieve shallower junction depths at equivalent processing conditions (e.g., a junction depth of about 20 nm vs a depth of about 30 nm following a 30 second RTA at a temperature of 550 Celsius). Second, Sn-based junctions also form relatively sharper junctions (e.g., junctions having about half the junction slope of a Si-based junction at equivalent conditions). Third, Sn-based junctions provide relatively higher n-type active carrier concentrations (i.e., highly-activated junctions). Sn-based junctions can achieve an active carrier concentration of about $26 \times 10^{12}/cm^2$ after a 30 second RTA at 550 Celsius followed by a one (1) second RTA at 850 Celsius. Finally, Sn offers a much larger change in dopant diffusion depth as a function of RTA temperature (Si dopant depths do not substantially change during RTA) without substantially changing the junction slope (i.e., a given Sn-based junction slope will not substantially change as a function of RTA temperature). The combination of a dopant diffusion that changes as a function of RTA conditions and a consistent junction slope that does not vary substantially with RTA conditions enables III-V compound semiconductor device gate-junction overlap (Cov) centering at an appropriate RTA to improve drive currents and short channel characteristics (e.g., RTA conditions can be tailored to provide a specific junction-gate overlap by dopant diffusion without affecting junction slope).

Example methods for fabricating a semiconductor device having abrupt, shallow, and highly activated Sn extension implant junctions and the resulting structures therefrom in accordance with embodiments of the present invention are described in detail below by referring to the accompanying drawings in FIGS. 1-4.

Figure 1:
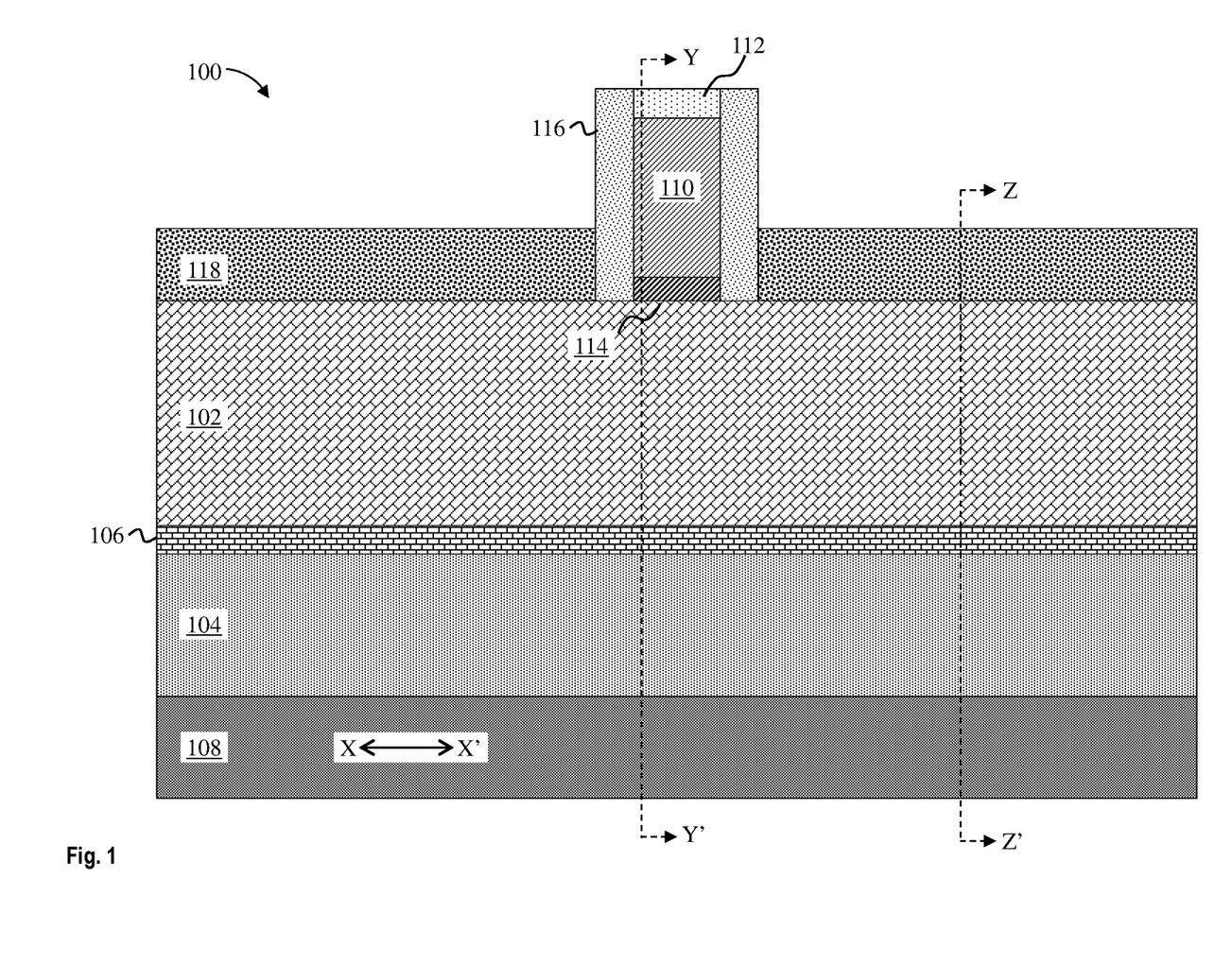
FIG. 1 depicts a cross-sectional view of a structure along a direction X-X' (parallel to fin direction) having a semiconductor fin formed on a substrate during an intermediate operation of a method of fabricating a semiconductor device according to one or more embodiments of the present invention.

FIG. 1 illustrates a cross-sectional view of a structure 100 along a direction X-X' (parallel to fin direction) having a semiconductor fin 102 formed on a substrate 104 during an intermediate operation of a method of fabricating a finFET semiconductor device according to one or more embodiments of the present invention. The semiconductor fin 102 can be formed on the substrate 104 using known finFET fabrication techniques. For example, in some embodiments, a patterned hard mask (not depicted) is etched to expose portions of the semiconductor fin 102. The exposed portions of the semiconductor fin 102 can then be removed to form a plurality of semiconductor fins. The patterned hard mask is then removed using an etch process, which can be a wet etch process, a dry etch process or a combination thereof. In other embodiments the semiconductor fin 102 is epitaxially grown on the substrate 104.

The semiconductor fin 102 can be made of any suitable material, such as, for example, Si, SiGe, III-V compound semiconductor material, or other suitable materials. Group III-V compound semiconductor materials include materials having at least one group III element and at least one group V element, such as, for example, one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys. In some embodiments, the semiconductor fin 102 is a InGaAs fin.

The substrate 104 can be made of any suitable substrate material, such as, for example, monocrystalline Si, SiGe, SiC, III-V compound semiconductor, II-VI compound semiconductor, or semiconductor-on-insulator (SOI). In some embodiments, the substrate 104 includes a substrate buffer 108. In some embodiments, the substrate 104 includes both an nFET Region and a pFET Region. In some embodiments, the substrate 104 includes either an nFET Region or a pFET Region. In embodiments where the semiconductor fin 102 is made of InGaAs, the substrate 104 can be InP.

In some embodiments, a semiconductor buffer layer 106 is formed between the semiconductor fin 102 and the substrate 104. The semiconductor buffer layer 106 can be made of any suitable material, such as, for example, Si, SiGe, III-V compound semiconductor material, or other suitable materials. In embodiments where the semiconductor fin 102 is made of InGaAs and the substrate 104 is made of InP, the semiconductor buffer layer 106 can be made of indium aluminum arsenide (InAlAs).

A sacrificial gate 110 is formed over channel regions of the semiconductor fin 102. Any known method for patterning a sacrificial gate (also known as a dummy gate) can be used, such as, for example, a wet etch, a dry etch, or a combination of sequential wet and/or dry etches. For example, in some embodiments, a layer of a-Si is etched using a patterned hard mask (not depicted). In some embodiments, hard mask 112 is formed on the sacrificial gate 110. The hard mask 112 can be made of any suitable material, such as, for example, a silicon nitride, silicon dioxide, SiON, SiC, SiOCN, or SiBCN. In some embodiments, a thin silicon oxide film (not depicted) is formed between the hard mask 112 and the sacrificial gate 110.

The sacrificial gate 110 can be replaced with a conductive gate (not depicted) using known finFET processes. The conductive gate can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials.

In some embodiments, a high-k dielectric 114 is formed between the sacrificial gate 110 (or the conductive gate after replacement) and the semiconductor fin 102. In some embodiments, the high-k dielectric 114 modifies the work function of the gate. The high-k dielectric 114 can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the high-k dielectric 114 can have a thickness of about 0.5 nm to about 4 nm, or about 2 nm to about 3 nm, although other thicknesses are within the contemplated scope of the invention.

In some embodiments, work function layers (not depicted) are formed between the high-k dielectric 114 and the sacrificial gate 110 (or the conductive gate after replacement). The work function layers can be made of work function materials, such as, for example, aluminum, lanthanum oxide, magnesium oxide, strontium titanate, strontium oxide, titanium nitride, titanium aluminum nitride, titanium aluminum carbide, tantalum nitride, and combinations thereof. In some embodiments, the work function layers further modify the work function of the gate.

In some embodiments, spacers 116 are formed on sidewalls of the sacrificial gate 110 and on surfaces of the semiconductor fin 102. In some embodiments, the spacers 116 are formed using a CVD, PECVD, ALD, PVD, chemical solution deposition, or other like process in combination with a wet or dry etch process. The spacers 116 can be made of any suitable material, such as, for example, a low-k dielectric, a nitride, silicon nitride, silicon dioxide, SiON, SiC, SiOCN, or SiBCN.

Doped regions 118 are formed on the semiconductor fin 102. The doped regions 118 can be source or drain regions formed in the substrate 104 by a variety of methods, such as, for example, in-situ doped epitaxy, doped following the epitaxy, or by implantation and plasma doping. In some embodiments, the doped regions 118 are complementary, such that one of the doped regions is a source while the other is a drain. The doped regions 118 can be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and MBE. In some embodiments, the doped regions 118 include epitaxial semiconductor materials grown from gaseous or liquid precursors. In some embodiments, epitaxial regions are epitaxially grown over the substrate 104 and/or the semiconductor fin 102. Epitaxial semiconductor materials can be grown using vapor-phase epitaxy (VPE), MBE, liquid-phase epitaxy (LPE), or other suitable processes. The doped regions 118 can be doped during deposition (in-situ doped) by adding dopants, n-type dopants (e.g., phosphorus or arsenic) or p-type dopants (e.g., Ga, B, $BF_2$, or Al). The dopant concentration in the doped regions 118 can range from $1 \times 10^{19}$ $cm^{-3}$ to $2 \times 10^{21}$ $cm^{-3}$, or between $1 \times 10^{20}$ $cm^{-3}$ and $1 \times 10^{21}$ $cm^{-3}$.

The doped regions 118 can be made of any suitable material, such as, for example, Si, SiGe, III-V compound semiconductor, or other suitable materials. In some embodiments, the doped regions 118 are raised source/drain regions formed from III-V compound semiconductor material. In some embodiments, the gas source for the deposition of epitaxial semiconductor material includes a silicon, a germanium, or a III-V compound semiconductor containing gas source, or a combination thereof. For example, an epitaxial InGaAs layer can be deposited from a gas source that is selected from the group consisting of arsine, trimethyl indium, and trimethyl gallium. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments, the doped regions 118 include silicon. In some embodiments, the doped regions 118 include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Conductive contacts (gate contacts and source/drain contacts, not depicted) can be formed or deposited using known finFET metallization techniques. In some embodiments, an interlayer dielectric (ILD, not depicted) is patterned with open trenches and the contacts are deposited into the trenches. In some embodiments, the contacts are overfilled into the trenches, forming overburdens above a surface of the ILD. In some embodiments, a CMP selective to the ILD removes the overburden. The contacts can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments, the contacts can be copper and can include a barrier metal liner. The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

Figure 2:
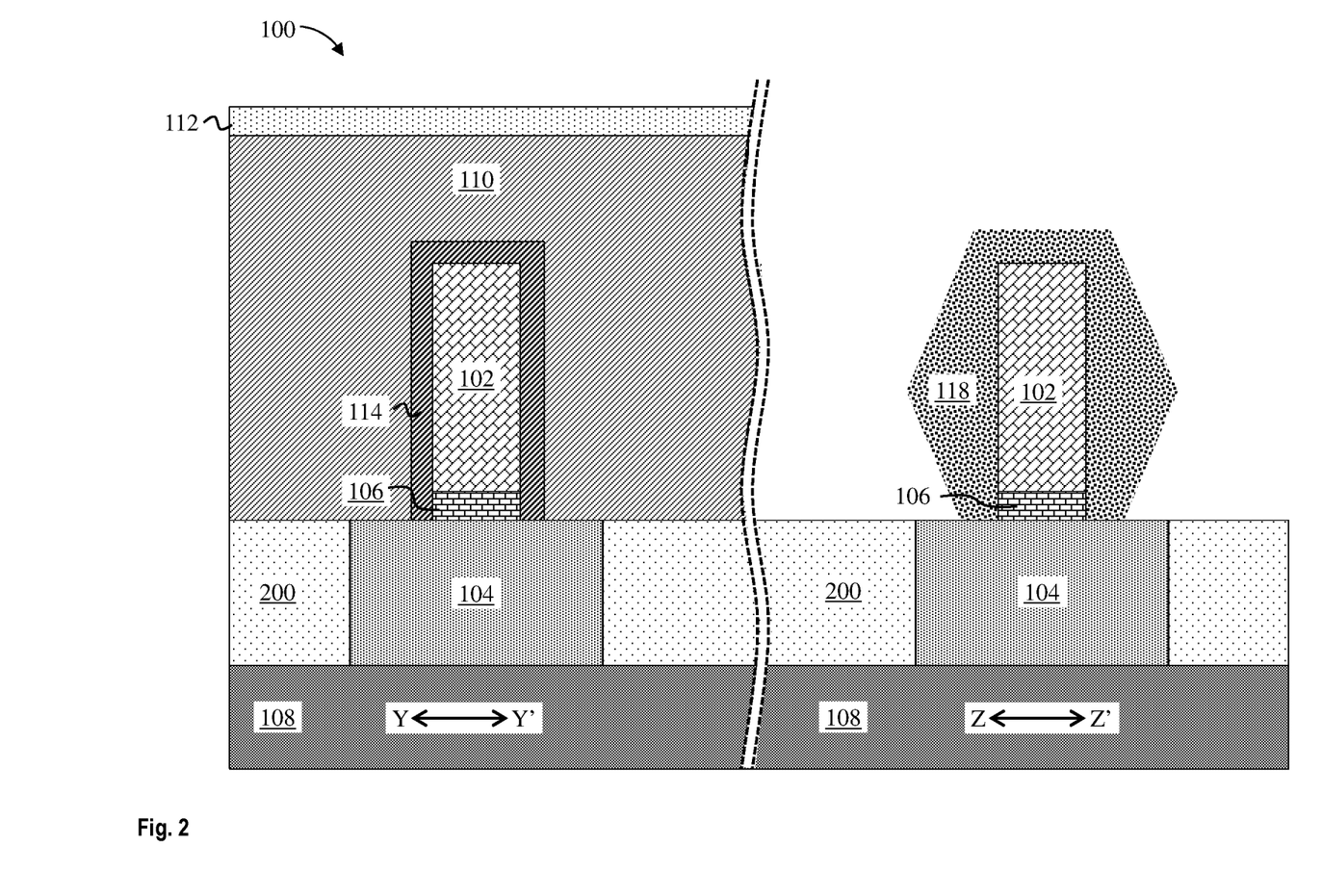
FIG. 2 depicts a cross-sectional view of the structure along lines Y-Y' (fin cross section under gate) and Z-Z' (fin cross section under source/drain) of FIG. 1 during an intermediate operation of a method of fabricating a semiconductor device according to one or more embodiments of the present invention.

FIG. 2 illustrates a cross-sectional view of the structure 100 along the lines Y-Y' (fin cross section under gate) and Z-Z' (fin cross section under source/drain) of FIG. 1 during an intermediate operation of a method of fabricating a semiconductor device according to one or more embodiments of the present invention. In some embodiments, a dielectric layer 200 is formed on the substrate buffer 108. The dielectric layer 200 can be made of any suitable dielectric material, such as, for example, porous silicates, carbon doped oxides, silicon dioxide, silicon nitrides, silicon oxynitrides, or other dielectric materials. Any known manner of forming the dielectric layer 200 can be utilized. The dielectric layer 200 can be formed using, for example, CVD, PECVD, ALD, flowable CVD, spin-on dielectrics, or PVD.

Figure 3:
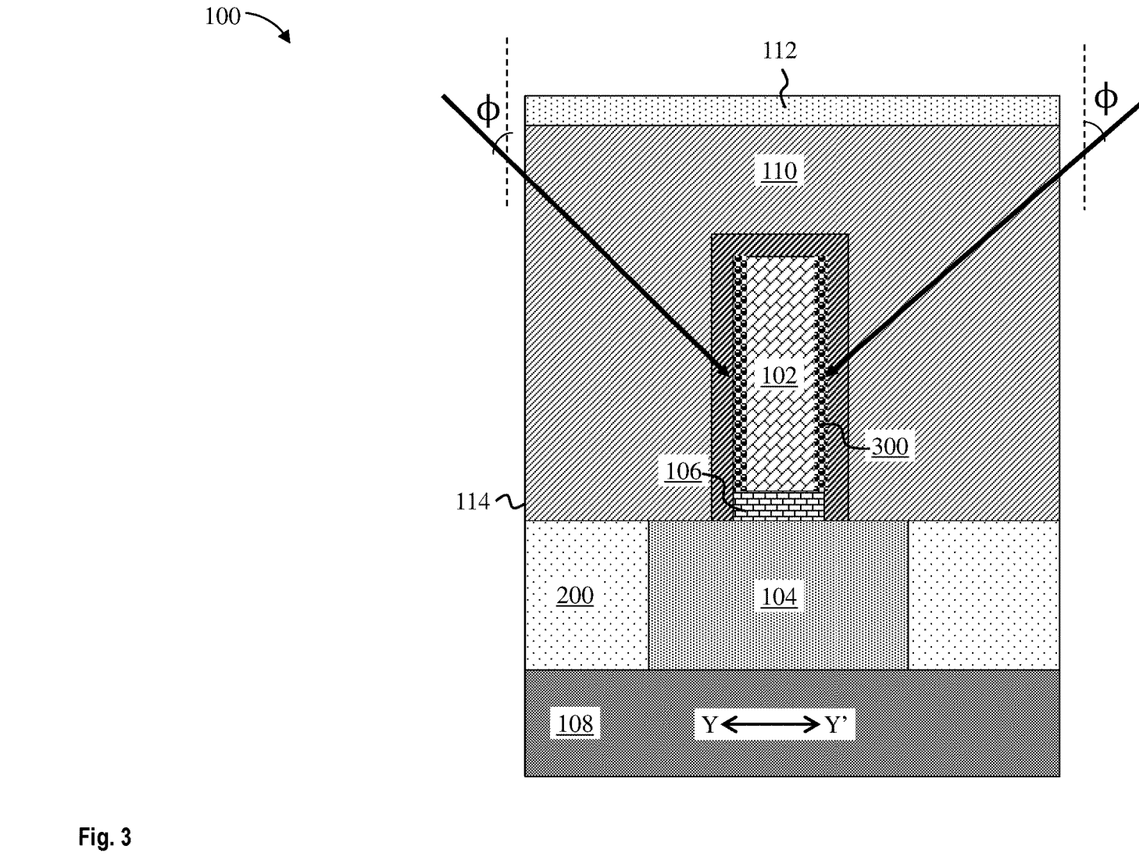
FIG. 3 depicts a cross-sectional view of the structure along the line Y-Y' (fin cross section under gate) of FIG. 1 after implanting a dopant to form a shallow, abrupt, and highly activated extension implant junction in a channel region of the semiconductor fin during an intermediate operation of a method of fabricating a semiconductor device according to one or more embodiments of the present invention.

FIG. 3 illustrates a cross-sectional view of the structure 100 along the line Y-Y' (fin cross section under gate) of FIG. 1 after implanting a dopant to form a shallow, abrupt, and highly activated extension implant junction 300 in a channel region of the semiconductor fin 102 during an intermediate operation of a method of fabricating a semiconductor device according to one or more embodiments of the present invention. In some embodiments, the extension implant junction 300 is a Sn extension implant n-type junction and the semiconductor fin 102 is a InGaAs fin (e.g., a $In_{0.53}Ga_{0.47}As$ fin).

A shallow, abrupt, and highly activated extension implant junction is desired for high device performance. To achieve a shallow, abrupt junction Sn dopants are implanted at an implant energy of less than about 5 keV, although other implantation energies are within the contemplated scope of the invention. As discussed previously herein, the Sn junction depth advantageously changes as a function of RTA conditions while the junction slope does not (e.g., RTA conditions can be tailored to provide a specific junction depth without negatively impacting junction slope and corresponding device performance). Any suitable annealing process can be used, such as, for example, laser spike annealing (LSA) at a temperature of about 500 to about 1000 degrees Celsius. In some embodiments, the junction depth is less than about 20 nm, or between 5 and 10 nm. In some embodiments, the junction depth is about 20 nm following a 30 second RTA at a temperature of 550 Celsius. In other embodiments, the junction depth is about 30 nm following a 30 second RTA at a temperature of 550 Celsius and a 5 second RTA at a temperature of 750 Celsius. In still other embodiments, the junction depth is about 46 nm following a 30 second RTA at a temperature of 550 Celsius and a 1 second RTA at a temperature of 850 Celsius. It is understood that other depths are within the contemplated scope of the invention. In some embodiments, the junction slope of the Sn extension implant junction 300 is about 6 nm/dec to about 8.5 nm/dec.

To achieve a highly activated junction Sn dopants are implanted at an ion beam tilt angle ϕ of about 7 to about 45 degrees (the angle ϕ is measured from the vertical plane, parallel, e.g., to the sidewalls of the semiconductor fin 102). In some embodiments, the ion beam tilt angle ϕ is about 45 degrees. An ion beam tilt angle ϕ of about 45 degrees advantageously provides the highest dopant concentration at a given implant energy. In some embodiments, the Sn dopant concentration in the extension implant junction 300 can range from about $1 \times 10^{19}$ cm$^{-3}$ to about $1 \times 10^{21}$ cm$^{-3}$ at an implant energy of less than about 5 keV.

Figure 4:
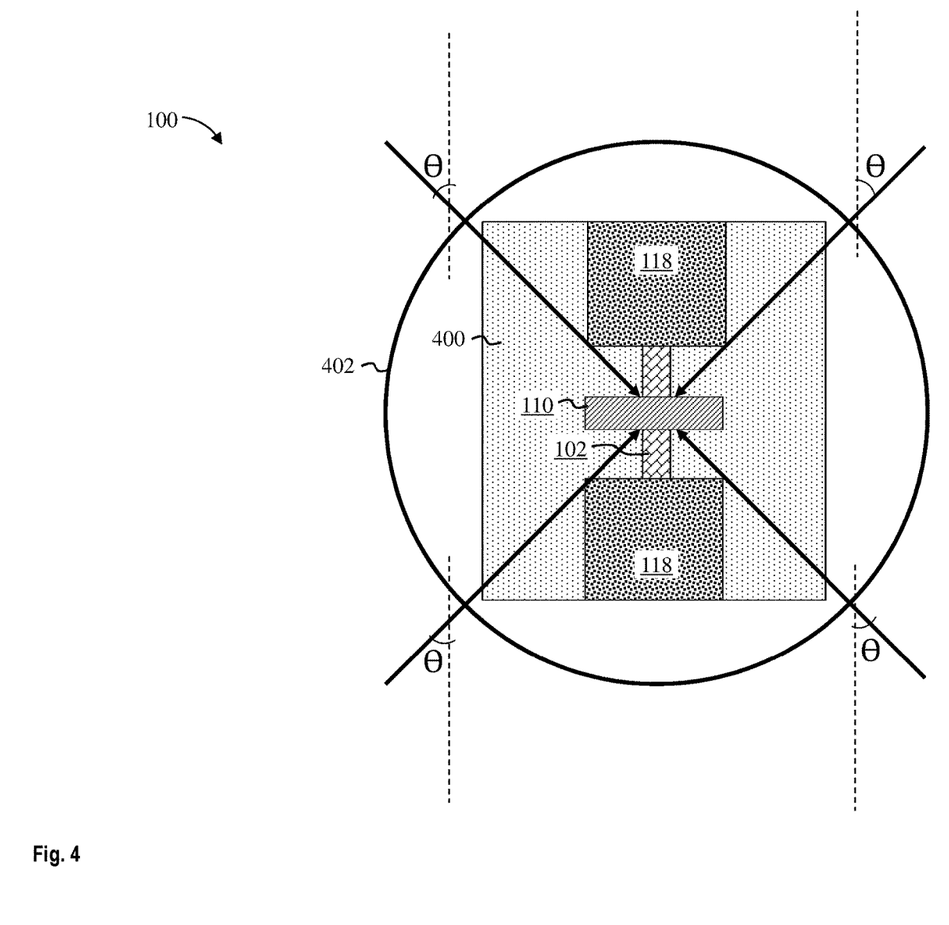
FIG. 4 depicts a top-down cross-sectional view of the structure during an intermediate operation of a method of fabricating a semiconductor device according to one or more embodiments of the present invention.

FIG. 4 illustrates a top-down cross-sectional view of the structure 100 during an intermediate operation of a method of fabricating a semiconductor device according to one or more embodiments of the present invention. From this view it is apparent that the structure 100 includes an integrated circuit 400 (including components such as, e.g., the semiconductor fin 102, the gate 110, and source/drain regions 118) and a wafer 402. It is understood that the components have been enlarged for clarity.

In some embodiments, the wafer 402 is successively rotated by a wafer twist angle Θ and an ion implantation is performed after each repositioning to further improve the quality of the extension implant junction 300 (depicted in FIG. 3). The angle Θ is measured from the horizontal plane, parallel, e.g., to the surface of the wafer 402. In some embodiments, the initial wafer twist angle Θ is 45 degrees and the wafer 402 is successively rotated by 90 degrees to a total of four ion implantation positions (e.g., if the first wafer position is twisted relative to the horizontal plane by 45 degrees, the second wafer position is twisted by 135 degrees, the third wafer position is twisted by 225 degrees, and the fourth wafer position is twisted by 315 degrees. In other embodiments, the wafer 402 is successively rotated by 60 degrees to a total of six ion implantation positions. It is understood that the initial wafer twist angle Θ and the number of repositions can be varied and other values are within the contemplated scope of the invention.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:
1. A method for forming a semiconductor device, the method comprising:
    forming a semiconductor fin comprising a III-V compound on a substrate;
    forming a gate over a channel region of the semiconductor fin; and
    implanting a tin (Sn) dopant directly on a surface of the III-V compound of the semiconductor fin in the channel region to form a Sn extension implant junction.
2. The method of claim 1, wherein the Sn extension implant junction comprises a junction depth of less than about 20 nm.

3. The method of claim 1, wherein implanting the tin (—Sn) dopant comprises using an implantation energy of less than about 5 keV.

4. The method of claim 3, wherein implanting the tin (Sn) dopant uses a concentration of about $1 \times 10^{19}$ cm$^{-3}$ to about $1 \times 10^{21}$ cm$^{-3}$.

5. The method of claim 1, wherein implanting the tin (Sn) dopant comprises using ion beam tilt angle of about 7 degrees to about 45 degrees.

6. The method of claim 5, wherein the ion beam tilt angle is 45 degrees.

7. The method of claim 5, wherein implanting the tin (Sn) dopant further comprises rotating the semiconductor fin prior to the Sn ion implantation.

8. The method of claim 7, wherein the semiconductor fin is rotated by an angle of about 90 degrees.

9. A method for forming a tin (Sn) extension implant junction in a channel region of a III-V compound semiconductor fin, the method comprising:
providing the III-V compound semiconductor fin on a wafer, the III-V compound semiconductor fin arranged on a semiconductor buffer layer;
positioning the wafer in a first position such that an ion beam tilt angle for implanting a dopant comprising Sn into the channel region is about 7 degrees to about 45 degrees;
implanting the dopant into the channel region while the wafer is in the first position;
rotating the wafer into a second position;
implanting the dopant into the channel region while the wafer is in the second position; and
forming a gate comprising a dielectric layer on the III-V semiconductor fin, the dielectric layer of the gate arranged on and covering vertical sidewalls of the semiconductor buffer layer and extending to a top surface of the III-V compound semiconductor fin.

10. The method of claim 9, wherein the semiconductor fin comprises indium gallium arsenide (InGaAs).

11. The method of claim 9, wherein rotating the wafer into the second position comprises rotating the wafer by about 90 degrees.

12. The method of claim 9, wherein the ion beam tilt angle is 45 degrees.

13. The method of claim 9, wherein implanting the dopant into the channel region further comprises a tin (Sn) ion implantation at an implantation energy of less than about 5 keV.

* * * * *